United States Patent
Moore et al.

(10) Patent No.: US 10,454,483 B2
(45) Date of Patent: Oct. 22, 2019

(54) OPEN LOOP OSCILLATOR TIME-TO-DIGITAL CONVERSION

(71) Applicant: ANALOG DEVICES, INC., Norwood, MA (US)

(72) Inventors: Ralph D. Moore, Greensboro, NC (US); Ryan Lee Bunch, Greensboro, NC (US); Carroll C. Speir, Pleasant Garden, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 242 days.

(21) Appl. No.: 15/332,152

(22) Filed: Oct. 24, 2016

(65) Prior Publication Data
US 2018/0115406 A1   Apr. 26, 2018

(51) Int. Cl.
| | |
|---|---|
| *H03L 7/00* | (2006.01) |
| *G04F 10/00* | (2006.01) |
| *H03L 7/085* | (2006.01) |
| *H04L 7/033* | (2006.01) |

(52) U.S. Cl.
CPC ............. *H03L 7/00* (2013.01); *G04F 10/005* (2013.01); *H03L 7/085* (2013.01); *H04L 7/0337* (2013.01)

(58) Field of Classification Search
None
See application file for complete search history.

(56) References Cited

U.S. PATENT DOCUMENTS

| | | | | |
|---|---|---|---|---|
| 5,208,833 A | * | 5/1993 | Erhart | H04L 7/0331 375/294 |
| 5,546,052 A | | 8/1996 | Austin et al. | 331/1 |
| 5,673,206 A | * | 9/1997 | Jones, Jr. | G11B 20/00007 709/219 |
| 5,699,387 A | | 12/1997 | Seto et al. | 375/376 |
| 7,180,339 B2 | | 2/2007 | Lanier | 327/115 |
| 7,332,973 B2 | * | 2/2008 | Lee | G04F 10/005 327/12 |

(Continued)

OTHER PUBLICATIONS

J. Daniels et al., AD conversion using an Asynchronous Delta-Sigma Modulator and a time-to-digital converter, 2008 IEEE International Symposium on Circuits and Systems (Year: 2008).*

(Continued)

*Primary Examiner* — Berhanu Tadese
(74) *Attorney, Agent, or Firm* — Patent Capital Group

(57) ABSTRACT

A time-to-digital converter (TDC) detects a timing relationship between signals representing two temporal events. Several samples are acquired over a certain time period for each event, and the signals related to the different events are digitized or quantized either by separate TDCs or by a single TDC in a time-sequential manner. The quantized results are then processed, for example added to/subtracted from one another, and used to determine the phase or time difference between the two events. When information being quantized is quasi-static over time periods where the measurement is performed, the instantaneous or "one shot" accuracy of a TDC need not be as good as or better than the desired time resolution. Digitally processing the signals and averaging the results moves an otherwise difficult analog quantizer problem to the digital domain where savings in power and chip area can be easily achieved without sacrificing accuracy.

20 Claims, 4 Drawing Sheets

(56) References Cited

U.S. PATENT DOCUMENTS

| | | | |
|---|---|---|---|
| 7,884,751 B2 | 2/2011 | Shimizu et al. | 341/166 |
| 8,275,085 B2* | 9/2012 | Yi | H04L 1/0003 375/360 |
| 8,494,105 B1* | 7/2013 | Patterson | H03D 13/002 375/294 |
| 8,558,728 B1* | 10/2013 | Lemkin | G01R 31/31709 341/166 |
| 8,674,244 B2* | 3/2014 | Kim | G04F 10/005 178/20.04 |
| 8,890,741 B2* | 11/2014 | Dosho | H03M 1/50 341/155 |
| 8,963,750 B2* | 2/2015 | Canard | G04F 10/005 327/107 |
| 9,225,507 B1* | 12/2015 | Lye | H04L 7/0331 |
| 9,450,594 B2* | 9/2016 | Kim | G04F 10/005 |
| 9,520,890 B1* | 12/2016 | Ben-Bassat | H03M 1/1014 |
| 9,548,750 B2* | 1/2017 | Tertinek | H03L 7/085 |
| 9,634,678 B1* | 4/2017 | Caffee | H03L 7/187 |
| 9,851,696 B2* | 12/2017 | Tertinek | H03L 7/085 |
| 10,007,235 B2* | 6/2018 | Wang | G04F 10/005 |
| 2003/0001557 A1 | 1/2003 | Pisipaty | 324/76.53 |
| 2003/0006750 A1* | 1/2003 | Roberts | G04F 10/00 324/76.53 |
| 2005/0195917 A1* | 9/2005 | Staszewski | H03C 3/0941 375/295 |
| 2007/0096836 A1* | 5/2007 | Lee | G04F 10/005 331/57 |
| 2007/0116169 A1 | 5/2007 | Robbe et al. | 375/376 |
| 2008/0238752 A1* | 10/2008 | Shimizu | G04F 10/005 341/155 |
| 2009/0072812 A1* | 3/2009 | Henzler | G04F 10/005 324/76.82 |
| 2009/0135975 A1* | 5/2009 | Yi | H04L 1/0003 375/360 |
| 2011/0032013 A1* | 2/2011 | Nelson | B60Q 1/444 327/156 |
| 2012/0013406 A1* | 1/2012 | Zhu | H03L 7/0992 331/34 |
| 2012/0306553 A1* | 12/2012 | Kim | H03M 1/06 327/158 |
| 2012/0313803 A1* | 12/2012 | Dosho | H03M 1/50 341/166 |
| 2013/0058437 A1* | 3/2013 | Oshima | H03M 1/0836 375/316 |
| 2013/0093470 A1* | 4/2013 | Lin | H03L 7/081 327/107 |
| 2013/0169457 A1* | 7/2013 | Helio | G04F 10/005 341/120 |
| 2013/0335251 A1* | 12/2013 | Dosho | G04F 10/005 341/166 |
| 2014/0104090 A1* | 4/2014 | Dosho | H03K 5/26 341/166 |
| 2014/0152484 A1* | 6/2014 | Dosho | G04F 10/005 341/166 |
| 2014/0201254 A1* | 7/2014 | Jenkins | H03H 17/0009 708/301 |
| 2014/0210525 A1* | 7/2014 | Jenkins | H03L 7/087 327/150 |
| 2014/0210532 A1* | 7/2014 | Jenkins | H03L 7/087 327/159 |
| 2014/0266848 A1* | 9/2014 | Henzler | G04F 10/005 341/166 |
| 2014/0320324 A1* | 10/2014 | Canard | G04F 10/005 341/131 |
| 2014/0320329 A1* | 10/2014 | Dosho | G04F 10/005 341/166 |
| 2014/0340250 A1* | 11/2014 | Dosho | H03K 3/0315 341/143 |
| 2014/0347205 A1* | 11/2014 | Dosho | H03K 5/26 341/166 |
| 2014/0362892 A1* | 12/2014 | Richley | G06K 7/10227 375/148 |
| 2015/0041625 A1* | 2/2015 | Dutton | G01T 1/2985 250/208.1 |
| 2015/0145570 A1* | 5/2015 | Perrott | H03L 7/093 327/157 |
| 2015/0241850 A1* | 8/2015 | Henzler | G04F 10/005 341/120 |
| 2015/0372690 A1* | 12/2015 | Tertinek | H03L 7/085 327/156 |
| 2016/0056827 A1* | 2/2016 | Vlachogiannakis | H03B 5/1265 327/158 |
| 2016/0204781 A1* | 7/2016 | Plusquellic | H03K 19/00323 326/8 |
| 2017/0085365 A1* | 3/2017 | Ravi | H04L 7/042 |
| 2017/0097613 A1* | 4/2017 | Tertinek | H03L 7/085 |
| 2018/0115406 A1* | 4/2018 | Moore | G04F 10/005 |
| 2019/0004563 A1* | 1/2019 | Nelson | H03L 7/0807 |
| 2019/0004565 A1* | 1/2019 | Nelson | H03L 7/0807 |
| 2019/0007055 A1* | 1/2019 | Nelson | H03L 7/0807 |

OTHER PUBLICATIONS

S. Henzler et al. 90nm 4.7ps-Resolution 0.7-LSB Single-Shot Precision and 19pJ-per-Shot Local Passive Interpolation Time-to-Digital Converter with On-Chip Characterization, IEEE, 2008, pp. 548-635. (Year: 2008).*

S. Henzler, *Time-to-Digital Converters*, Springer Series in Advanced Microelectronics 29, 5 ISBN: 978-90-481-8627-3, Springer Science+Business Media B.V. 2010.

Francesco Brandonisio et al., *First Order Noise Shaping Local-Oscillator Based Time-to-Digital Converter*, 17th IEEE International Conference on Electronics, Circuits, and Systems (ICECS), 2010, pp. 41-44.

Francesco Brandonisio et al., *An All-Digital PLL with a First Order Noise Shaping Time-to-Digital Converter*, Proceedings of 2010 IEEE International Symposium on Circuits and Systems, May 30, 2010-Jun. 2, 2010, pp. 241-244.

Yongsam Moon et al., "*A 0.6-2.5-GBaud CMOS tracked 3×oversampling transceiver with dead-zone phase detection for robust clock/data recovery*", IEEE Journal of Solid-State Circuits (vol. 36, Issue: 12, pp. 1974-1983, Dec. 2001).

Wu-Hsin Chen et al., "*Phase Frequency Detector With Minimal Blind Zone for Fast Frequency Acquisition*", IEEE Transactions on Circuits and Systems II: Express Briefs (vol. 57, Issue: 12, pp. 936-940 ) 2010.

Kuo-Hsing Cheng et al., "*A difference detector PFD for low jitter PLL*", Electronics, Circuits and Systems, 2001. ICECS 2001. The 8th IEEE International Conference on (vol. 1, pp. 43-46).

Ying Cao et al., "*A 1.7mW 11b 1-1-1 MASH ΔΣ time-to-digital converter*", 2011 IEEE International Solid-State Circuits Conference (2011, pp. 480-482).

* cited by examiner

OPEN LOOP OSCILLATOR TIME-TO-DIGITAL CONVERSION

TECHNICAL FIELD OF THE DISCLOSURE

Time-to-digital conversion (TDC) of phase or time differences between two events, for example a clock signal and a synchronization signal or more generally between two clock signals, can be performed with sub-gate delay resolution by processing the phase differences between the signals in the digital domain. Accuracy better than the least significant bit (LSB) resolution of the time-to-digital converters can be achieved. The time measurements are not affected by the presence of a dead zone between the events.

BACKGROUND

A time-to-digital converter (TDC) detects a temporal characteristic or a phase of a signal to be measured with respect to a reference clock, or between signals representing two temporal events, using a time difference measurement between for example two events. The resulting single signal represents the time (or phase) difference as a pulse with a width equaling the time interval between these events. A major limitation for time-to-digital converter (TDC), in particular flash TDCs, is that as the time difference approaches zero ($\Delta t \rightarrow 0$), the resulting pulse cannot be determined. This limitation is referred to as a dead zone or blind zone. In ordinary phase comparators, the dead zone results from the non-zero response times of the logic gates of the comparator, meaning that time differences smaller than these response times are not detected.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Figure 1:
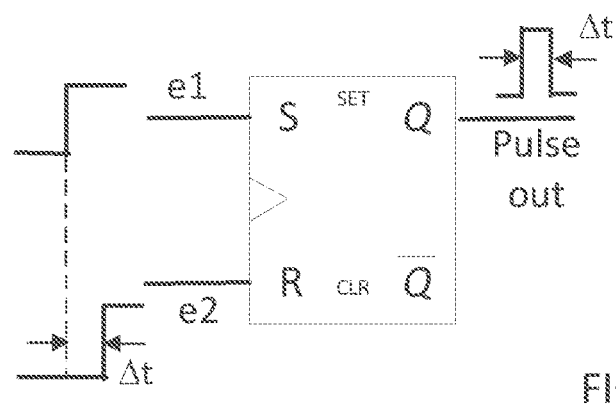
FIG. 1 shows schematically a conventional SR (set-reset) latch.

A time-to-digital converter (TDC) detects a phase or time relationship between signals, each representing a temporal event. A pair of TDCs with multiple clock phases from an open loop gate based ring oscillator, DLL, or PLL are used to independently quantize two signals so that the information may then be digitally filtered to an accuracy better than the linearity and precision of a single TDC alone. Digitally processing the signals and averaging the results takes an otherwise difficult analog quantizer problem and moves it to the digital domain where savings in power and chip area can be easily achieved without sacrificing accuracy. Sample clock phases are derived from an open loop oscillator (OLO).

In certain embodiments a method is provided that discloses measuring phase delays between analog input signal events, which includes the steps of clocking a plurality of time-to-digital converters (TDC) with at least one common clock phase from a sample clock; receiving a first input signal event with a first of the TDCs and generating a first time-quantized digital output signal, and receiving a second input signal event with a second of the TDCs and generating a second time-quantized digital output signal; forming a difference between the first and second time-quantized digital output signals, and determining from the difference a temporal separation between the input signal events.

In certain embodiments a circuit for measuring phase delays between input signal events is provided that includes a plurality of time-to-digital converters (TDC), each TDC receiving a respective input signal event and generating a respective time-quantized digital output signal; a sample clock clocking the plurality of TDCs with at least one common phase from a sample clock, and an adder forming a difference between the time-quantized digital output signals from different TDCs and determining therefrom a temporal separation between the input signal events.

In some approaches, a deliberate time or phase offset, which biases the operation point of the phase detector away from the dead zone, was introduced into either the clock signal or the compared signal prior to presentation to the TDC. In other approaches, sub-picosecond (ps) time resolution for $\Delta t$ measurements can be achieved by using a gated-ring-oscillator (GRO); however, a CMOS gate delay of even as low as 6 picoseconds still makes high-speed circuits with TDCs difficult to implement. The oscillator is enabled at a start event and its phase is then ideally frozen at a stop event. On the next start event, the oscillator ideally begins oscillating at the previous phase. However, gate leakage significantly limits the ability to preserve phase from the stop event even to the next start event, which causes a dead zone. Since leakage generally gets worse as the geometry gets smaller, i.e., for faster circuits, the performance of the GRO architecture can be significantly diminished. It would therefore be desirable to provide an improved system and method for determining phase alignment or a time difference between two clock signals, in particular when the time difference is less than the response time of logic gates.

SR (set-reset) latches, like D-flip-flops, may be used in analog-to-digital converters (ADC) or TDCs to sample the synchronization signal (hereinafter e1) with a signal or pulse from a reference clock (hereinafter e2). The SR latch and D-flip-flop may respond to a rising edge of the respective signals. When another device or circuit sends a synchronization signal and the synchronization and reference signals arrive at approximately the same time, i.e., the edges of the e1 and e2 signals are almost perfectly aligned, the setup time of the flop would be violated and no reliable output pulse would be generated.

In the specification, the terms "time" or "timing" and "phase" are used synonymously when describing relationships, for example delays, between two or more signals or their characteristic features such as rising or falling edges associated with temporal events.

To address this problem, it is proposed to first digitize or quantize both the e1 and e2 signals independently with respective TDCs and to form the difference between the quantized signals in the digital domain. The temporal characteristic of the e1 and e2 signals is assumed to vary relatively slowly during the quantization (this slow variation will hereinafter also be referred to as quasi static) so that the signals can be oversampled which increases the time resolution and may thus prevent a dead zone and produce processing gain. Noise is spread from DC to the half the frequency of the time events being measured, and can be removed by digital filtering. Sample clock jitter has virtually no effect on the computed digital difference signal as long as the TDCs quantizing the events use the same clock signals for sampling the difference measurement. Jitter can be shown to be actually beneficial by allowing a time resolution of the phase difference below the least significant bit (LSB) of the TDCs.

The proposed approach enables the use of temporally less precise, and noisier sample clocks and TDCs with less time resolution, both of which reduce the overall power consumption of the chip while actually improving the accuracy of the phase and frequency relationship between different circuits on the same chip or on different chips.

Figure 2:
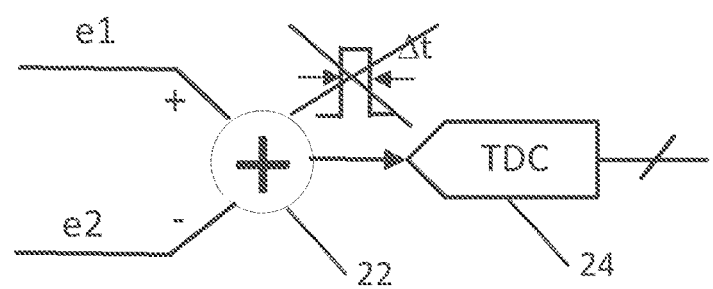
FIG. 2 shows schematically a difference pulse supplied to a TDC.

For a better understanding of the inventive concept in view of time-resolution limitations of a flash TDC, FIG. 1 shows a SR latch receiving at input S a signal e1 and receiving at input R a signal e2. The output Q goes high when S goes high, and then goes low again when the input R goes high. Inputs S and R are referred to as SET and RESET inputs. The aperture of the latch or flip-flop, i.e., the time when the output Q is high, meaning that an output pulse can be generated, is determined by the sum of the so-called setup and hold times. The setup time is the minimum amount of time the data input should be held steady before the clock event, and the hold time is the minimum amount of time the data input should be held steady after the clock event, so that the data can be reliably sampled by the clock. One can see, as schematically illustrated in FIG. 2, that a reliable output pulse reflecting the time difference between the e1 and the e2 signals or pulses, or their respective edges, cannot be generated by a D-flip-flop or SR latch, shown in FIG. 2 as adder 22, when the respective edges of e1 and the e2 signals or pulses are spaced so closely in time as to produce a dead zone. Consequently, in the absence of a reliable output pulse at output Q, a single flash TDC 24 is then also unable to generate a meaningful digital output signal.

In some approaches, when setup and hold time violations were detected, i.e., when a dead zone was present due to a substantially perfect alignment between the e1 and the e2 signals, the phase of one of the signals, i.e., e1, was deliberately adjusted, so that the phase of the e2 signal could be recovered and the converters resynchronized. The e2 signal may be considered as the sample clock, whereas the e1 signal may be a divided version of the e2 signal having, for example, a clock period that is an integer multiple of the reference clock period. In other words, the e1 signal has a much lower frequency, and the idea is to capture the phase of the e1 signal and to align multiple TDCs to the same e1 signal and hence to the same reference clock. In a phase locked loop, a voltage-controlled oscillator (VCO) would be servo'ed to match the e1 signal.

As mentioned above, due to the setup and hold requirements for the digital circuits, in particular the TDCs, the frequency range for operating the digital circuits to accurately capture the phase of the e1 signal with respect to a reference clock, in this example e2, is limited. A first step in the process is therefore to overcome the setup and hold requirements and to accurately capture the timing or phase relationship, in particular when the phases are already closely aligned. The next step is then to be able to capture the e1 signal regardless of its phase relationship to the reference e2 signal and to measure the time between the two signals e1 and e2, for example between their rising edges, with much higher accuracy than can be provided by a single (one-shot or flash) TDC. In other words, the effect of inherent setup and hold requirements on the measurement is thus eliminated and the accuracy of measurement of the phase relationship between these two signals, i.e. of the time difference $\Delta t$, is greatly increased. The time difference $\Delta t$ may thereafter be used to align the output phases of the TDCs. For example, since the detected time difference between the TDCs is essentially a phase detector, the output $\Delta t$ may be used to control a DCO (digitally controlled oscillator).

Figure 3:
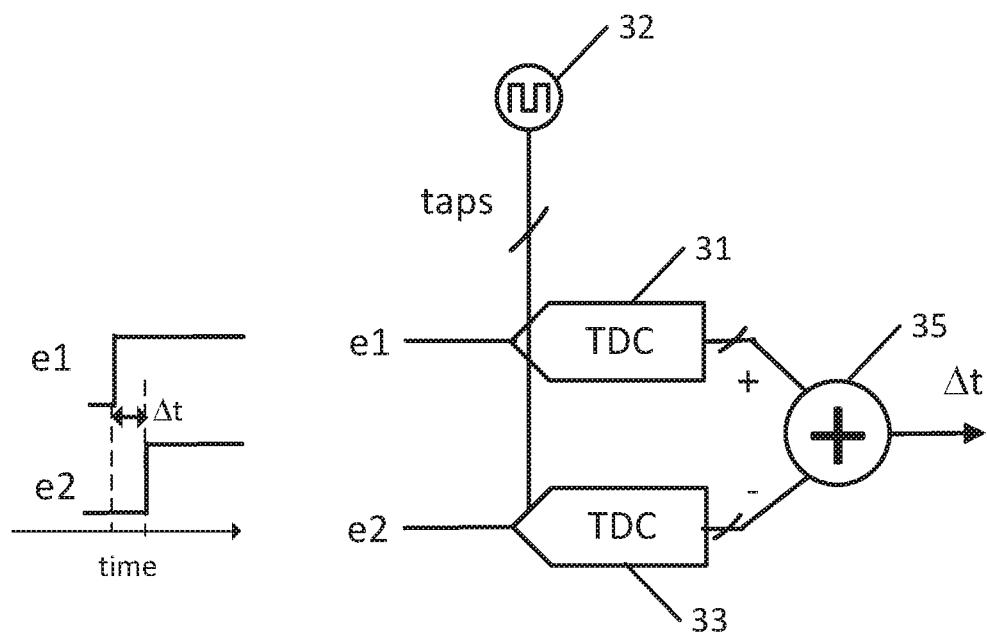
FIG. 3 shows an exemplary circuit with two TDCs controlled by an open loop oscillator (OLO), according to some embodiments of the disclosure.

According to some embodiments of the disclosure illustrated in FIG. 3, two separate TDCs may be used to separately digitize or quantize the e1 signal and the e2 signal, or their respective edges. The digitized or quantized signals are thereafter processed in the digital domain. For example, the e1 signal may be supplied to a first TDC 31, which may be a flash TDC, and digitized or quantized with respect to time. Likewise, the e2 signal may be supplied to a second TDC 33, which may also be a flash TDC, and likewise digitized or quantized with respect to time. Because the same sample clock 32 is used in both TDCs 31, 33, the respective digital output signals from the TDCs 31, 33 are always temporally aligned in spite of any imperfections of the sample clock 32 (e.g., frequency drift, jitter), since the time difference $\Delta t$ or phase offset between the digitized e1 signal and the digitized e2 signal is computed in adder 35 for the same time instant after the quantization in the TDCs 31, 33.

Figure 5:
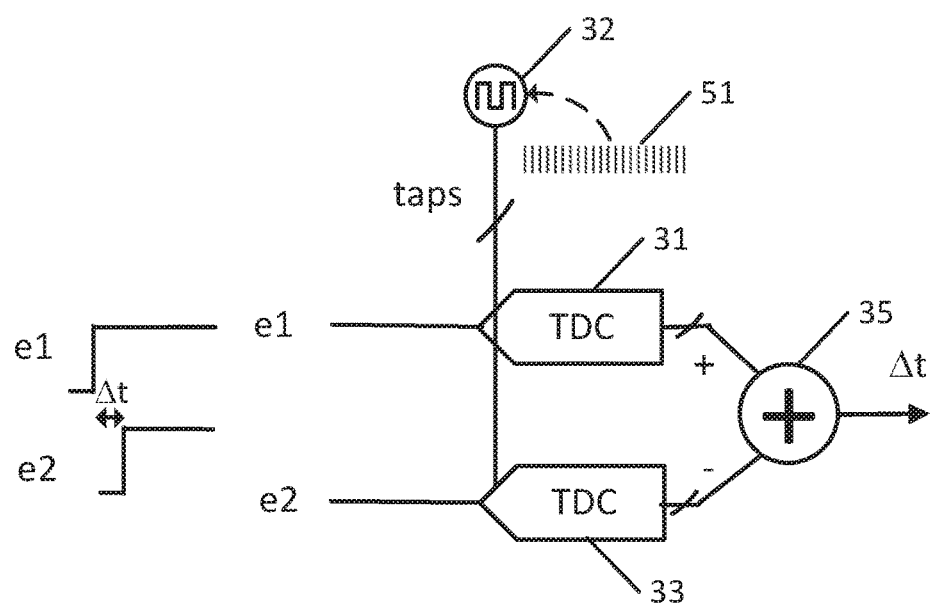
FIG. 5 shows the exemplary circuit of FIG. 3 with two TDCs and added time dither, according to some embodiments of the disclosure.
Figure 6:
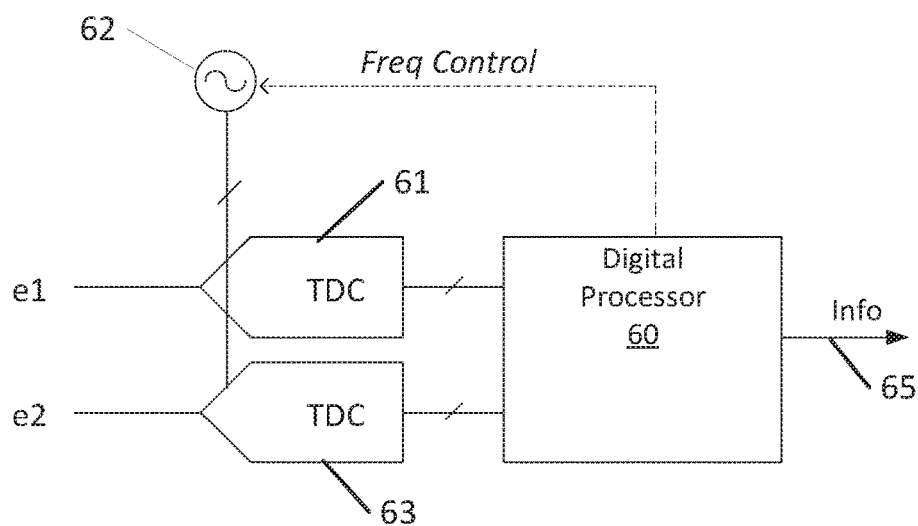
FIG. 6 shows another exemplary circuit with two TDCs with additional frequency control of the OLO, according to some embodiments of the disclosure.

Although the embodiments depicted in FIGS. 3, 5 and 6 show two exemplary TDCs, these illustrations are for sake of clarity of the drawing only, and it will be understood that more than two TDCs may be employed for determining the phase or time relationship between multiple events.

The sample clock 32 in FIG. 3 operates in open-loop and is shared by the two exemplary TDCs 31, 33. It will be understood that the time differences $\Delta t$ or phase offsets of more than two TDCs can be determined and subsequently mutually aligned. The sample clock 32 may have a number of taps producing a number of different phases of the sample clock at the clock frequency. For example, a flash TDC may have four clock phases offset by 90°, referred to as quadrature clock reference, allowing the same input to be sampled with these four different phases, i.e. in this example at four different times. This device is a time quantizer, similar to a flash analog-to-digital (A/D or ADC) converter with multiple comparators which sample the input and determine its location relative to different voltage taps, except that the comparison in the time quantizer is in the time domain. The dynamic range of the TDC, i.e. the number of resolvable bits, increases proportional to the number of phases. For example, the sample clock phases may be spaced 100 picoseconds apart which would allow determining the location of the rising edge of e1 with an accuracy of +/−50 picoseconds, representing the LSB of the TDC. However, if greater accuracy, i.e. higher resolution, and/or higher frequency operation is desired, the TDCs can become quite complex and unwieldy, like a fast high-resolution flash ADC, taking up a large area on the chip and having a high power demand.

According to some embodiments of the disclosure; the exemplary TDCs 31, 33 may sample a large number of e2 and e1 signals or pulses over time and average the respective sampled signals. For example, when using a pair of TDC's with for example 100 ps per sample accuracy and averaging over for example 100 samples, the relative phases can now be measured with substantially higher accuracy, for example 1 ps, since the accuracy for a static or quasi-static phase relationship between e1 and e2 increases with the number of samples being averaged. Assuming Δt is not changing very fast during the time multiple samples are acquired, hereinafter referred to as quasi-static, an instantaneous high-precision measurement of Δt becomes unnecessary, thus obviating the need for using a higher-accuracy one-shot (flash) TDC which may take up a large area on the chip and consume a significant amount of power.

One proposed approach disclosed herein for improving the time resolution of the time-difference signal Δt determined by the aforementioned exemplary two TDCs will now be explained with reference to enhancing the LSB voltage resolution of an ADC. For example, an N-bit ADC having an inherent resolution of one LSB has due to the presence of quantization noise, thermal noise, reference noise, clock jitter, etc. an effective number of bits (ENOB) that is less than N. Oversampling is a common method used for improving ADC resolution. For example, when using an N-bit ADC without oversampling, an input signal of 100 Hz is sampled at 200 Hz (2×100 Hz), which is the minimum required Nyquist sampling rate, fs, to get the digital output with the native ENOB of the ADC. When oversampling with a factor of k=16, the same 100-Hz input signal is sampled at 3200 Hz (k×2×100 Hz). The samples obtained by oversampling are thereafter low-pass filtered and decimated using a digital filter to reduce noise. The signal at the frequency band of interest is not affected by the filter, and the result is an improved SNR of SNR (dB)=(6.02×N)+1.76+10×log 10 (k). When quantization noise is modeled as white noise that is additive to the input signal while sampling, an oversampling factor k of 256 (=28) can increase the resolution of a 12-bit ADC to 16 bits.

The same reasoning can now be applied, mutatis mutandis, to time-to-digital converters (TDC). In other words, oversampling increases the time resolution of the TDCs and the process gain. Furthermore, because both TDCs 31, 33 operate from the same sample clock 32, the clock 32 need not be a low jitter source and does not need to be synchronous to the events being quantized. As with a conventional gated ring oscillator (GRO), the oscillator clock rate may not and need not have an integer relation to the start/stop events. In fact it is advantageous for the sample rate and the event rates to have a non-integer relationship so that they are non-coherent, i.e., not phase-locked. Furthermore, if the clock 32 is implemented as an open loop oscillator (OLO) and has a form of analog or digital control, its frequency can be changed to prevent phase locking, which will be described below with reference to FIG. 6.

According to some embodiments of the disclosure; the inventors have realized that jitter in the sample clock 32 can be constructive in terms of measurement accuracy because the TDCs 31, 33 share the same sample clock phases (labelled taps in FIG. 3). When there is any movement or jitter in the sample clock 32, both TDC's 31, 33 see the same temporal movement, which then cancels out when forming the digital difference between the quantized signals in adder 35. If there was no jitter and and/or variation in the phase relationship between the sample clock 32 and the event signals e1 and e2, the sample clock may easily become phase-locked to, for example, e1, thus producing a static phase relationship between the sample clock phases and e1 or e2. The same sample clock phase may then catch the rising edge of both e1 and e2, which would represent a dead zone. The present scenario with jitter avoids the dead zone and is therefore beneficial for the measurement accuracy.

The benefit of maintaining a non-coherent phase relation is that using the full range of the sampling circuits within the TDC is much like using the full range of an ADC with voltage dither. The described TDCs have no range limit so if the sampled events trigger on all of multiple sampling circuits within the TDC, this suppresses sample mismatch and TDC nonlinearity by avoiding the static timing/phase situation in which the event is captured repetitively by a single sampling circuit. Again this takes advantage of oversampling and linearization through dither, wherein non-linearities are converted to noise and averaged.

Voltage dither in ADCs refers to a random noise (white noise), which is added to the input before conversion. It causes the state of the LSB to randomly oscillate between 0 and 1 in the presence of very low levels of input, rather than stick to a fixed value. Rather than simply cutting off the signal at the LSB level (representing a resolution of 1 bit), the effective range of signals that the ADC can convert is extended, at the expense of a slight increase in noise—effectively the quantization error is diffused across a series of noise values which is far less objectionable than a hard cutoff. The result is an accurate representation of the signal over time. A suitable filter at the output of the system can thus recover this small signal variation.

Figure 4:
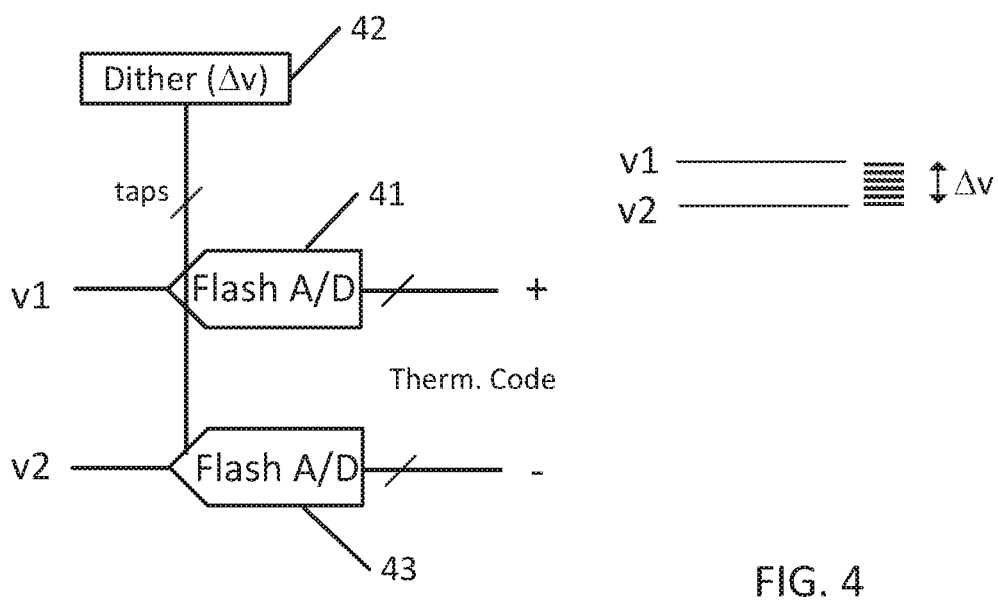
FIG. 4 shows an exemplary circuit with two flash ADCs and added voltage dither, for enhancing LSB resolution in voltage measurements.

FIG. 4 shows an exemplary embodiment of voltage dithering for an ADC for detecting small differences between input voltages v1 and v2 at a resolution better than the inherent single-shot LSB resolution of a flash ADC. The input voltages v1 and v2 are each supplied to respective inputs of flash ADCs 41, 43 which each generate a digital output signal (+) and (−), for example in thermometer code. A common dither signal from a dither generator 42, as indicated by the scale in the inset of FIG. 4, is added to each voltage input. Since the values are then subtracted from each other, dithering does not affect the result (v1−v2) which is now more precise than the LSB of the single analog-to-digital converter, thus increasing the resolution of a sampling circuit and/or of the ADC.

According to some embodiments of the disclosure illustrated in FIG. 5, dithering in the time domain may be applied to the TDCs of FIG. 3 by intentionally dithering the sample clock 32, as indicated by the scale 51 in FIG. 5, for increasing the LSB time resolution of the TDCs and, as mentioned above, potentially preventing phase-locking between the sample clock 32 and the signals e1 and e2. The terms dither and jitter are used synonymously in the context of this specification, since they have the same effect on the signal processing. Again, the phase relationship between the sample clock and the signals e1 and e2 will be assumed to be substantially static over the measurement time.

A static phase relationship between the open-loop oscillator (OLO) or sample clock 32 in relation to the two signals represented by e1 and e2 may create phase-locking, meaning that the sample clock and the signals e1 and e2 maintain a constant phase relationship over the sampling time, for example when the OLO frequency has an integer relationship to the occurrence of the sampled events. To remedy this problem, according to some embodiments of the disclosure, the phase of the OLO may be unlocked by shifting the OLO frequency by adding frequency control to the OLO, for example by way of an oscillator (sample clock) 62 which is still open loop and may still be quite jittery, but which has a controllably changeable frequency. A digital processor 60 may adjust the frequency of sample clock 62, for example based on the digital output signals from TDCs 61 and 63, on the basis of which $\Delta t$ between e1 and e2 may then be determined. In addition, the frequency of the oscillator may also be intentionally "dithered", i.e. intentionally randomized. This additional feature may useful when the "jitter", i.e. randomized phase changes, is not sufficient for a given application. The digital processor 60 may include an adder 35 (FIGS. 3 and 5). This change in the sample clock frequency may be generated over a plurality of sample clock cycles, much like the aforedescribed oversampling and/or dither, and will at most insignificantly affect the detected signals e1 and e2 because the sample clock is commonly applied to both TDCs 61 and 63. As mentioned above, there is no need to find an instantaneous $\Delta t$ since the phase relationship between e1 and e2 is quasi-static, i.e., does not change noticeably while the signals e1 and e2 are sampled and quantized over the plurality of sample clock cycles.

Figure 7:
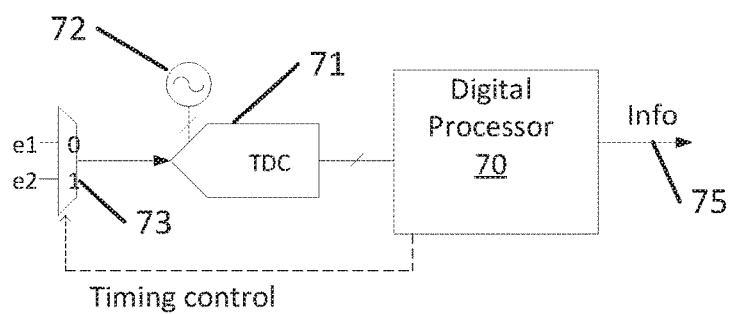
FIG. 7 shows yet another exemplary circuit with a single TDC and time-sequential quantization, according to some embodiments of the disclosure.

According to some embodiments of the disclosure illustrated in FIG. 7, the two events e1, e2 may be acquired time-multiplexed at different time instances and supplied to a single TDC 71, instead of to the two exemplary TDCs 31, 33 in FIG. 3. This may minimize a potential mismatch that may occur between two separate TDCs, for example due to process variations. The information would hereby be processed time-sequential, meaning first an event e2 is inputted in multiplexer 73 (indicated by the state {0, 1}), followed by another event e1 (state {1, 0}, not shown), and thereafter again event e2 (state {0, 1}). Each of the events e1, e2 may alternatingly be monitored for a certain amount of time. I.e., every time there is a transition, the period of e1 and the phase associated therewith may be measured for a specified window of time, followed by e2 in a different window of time, and so on. This embodiment likewise uses an open loop oscillator or sample clock 72 and may have a slightly reduced accuracy compared to the embodiment of FIG. 6. This approach again assumes that the time difference $\Delta t$ between the events e1 and e2 changes slowly, if at all, i.e., is quasi-static, over the measurement time frame.

The advantages of using OLO TDCs can be summarized as follows:
  Relaxed design requirements compared to single-event (flash) TDCs.
  Differential measurements are insensitive to jitter of the sampling clock and to TDC nonlinearity. The accuracy actually improves with relative event frequency and as the phases become more closely aligned ($\Delta t \rightarrow 0$).
  Digital filtering/averaging determines measurement resolution for slowly varying (quasi-static) events, resulting in lower TDC power and reduced chip area. The filtering itself could be static or adaptive.
  Open loop oscillator TDC has no range limitation due to non-coherent phase relationships.
  Dead-zone free seamless measurement with no start/stop event limitation.
  Robust and insensitive to gate leakage.
  Constructive use of oscillator noise/jitter.
  No need for digital processing capable of operating at the oscillator rate.

The result from the determination of $\Delta t$, labelled for example "Info" 65 and 75, respectively, in FIGS. 6 and 7 can be used, for example, to control the phases and likewise the frequencies of oscillators in a phase-locked loop, such as DCO (digitally controlled oscillators). Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete phase-locked-loop building block, the technique may be used in modern electronic devices, with output frequencies from a fraction of a hertz up to many gigahertz.

It should be noted that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

In certain contexts, the features discussed herein can be applicable to
  Measurement of on-chip clock skew
  Deskewing
  Quantization of voltage, current, charge in ADCs
  Recovery of small signals that otherwise would be lost in noise (lock-in amplifier to track the reference frequency)
  Recovery of clock timing information from a data stream such as from a disk drive
  Clock generation/clock distribution/clock multiplication, for example, in microprocessors that allow internal processor elements to run faster than external connections, while maintaining precise timing relationships
  DTMF decoders, modems, and other tone decoders, for remote control and telecommunications
  DSP of video signals; phase-locked loops are also used to synchronize phase and frequency to the input video signal so it can be sampled and digitally processed, and
  DC motor drives.

It should also be noted that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures, illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The "means for" in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. An oversampling time-to-digital converter system for measuring time/phase delays between input signal events with improved resolution than a single one-shot time-to-digital converter, comprising:
   a common sample clock clocking a plurality of time-to-digital converters (TDCs);
   the plurality of TDCs, each TDC receiving a respective input signal event and quantizing the respective input signal event to generate a respective time-quantized digital output signal representing the respective input signal event with respect to the common sample clock; and
   an adder receiving the respective time-quantized digital output signals from the TDCs, forming a difference between the respective time-quantized digital output signals from the TDCs, and determining from the formed difference a temporal separation between the input signal events.

2. The oversampling time-to-digital converter system of claim 1, wherein the common sample clock generates a plurality of clock phases.

3. The oversampling time-to-digital converter system of claim 1, wherein:
   the plurality of TDCs separately sample the respective input signal events over a plurality of clock cycles of the common sample clock; and
   determining from the formed difference comprises averaging the difference.

4. The oversampling time-to-digital converter system claim 3, wherein the temporal separation between the input signal events is quasi-static during the plurality of clock cycles.

5. The oversampling time-to-digital converter system claim 1, wherein the common sample clock applies a time-dependent dither to at least one common phase of the common sample clock.

6. The oversampling time-to-digital converter system claim 5, wherein the time-dependent dither increases temporal resolution of the separation between the input signal events to improve accuracy of the oversampling time-to-digital converter system than one least significant bit of the plurality of TDCs.

7. The oversampling time-to-digital converter system claim 2, further comprising a digital processor configured to change a frequency of the common sample clock to prevent phase-locking between the respective input signal events and the common sample clock.

8. The oversampling time-to-digital converter system claim 7, wherein the digital processor changes a frequency of the common sample clock based on the temporal separation between the respective input signal events.

9. A method for increasing accuracy of phase delay measurement between input signal events based on oversampling of the input signal events, comprising:
   clocking a plurality of time-to-digital converters (TDCs) with a common sample clock,
   sampling, over a plurality of clock cycles, a first input signal event with a first of the plurality of TDCs with respect to the common sample clock and generating a first time-quantized digital output signal, and sampling, over the same plurality of clock cycles, a second input signal event with a second of the plurality of TDCs with respect to the common sample clock and generating a second time-quantized digital output signal, and
   averaging a difference formed in a digital domain between the first and second time-quantized digital output signals to determine a temporal separation between the first input signal event and second input signal event.

10. The method of claim 9, wherein the common sample clock generates a plurality of clock phases.

11. The method of claim 9, further comprising forming the difference between the first and second time-quantized digital output signals, wherein the difference is insensitive to jitter of the common sample clock.

12. The method of claim 9, wherein the accuracy of the phase delay measurement increases with a number of samples of the difference being averaged.

13. The method of claim 9, wherein the temporal separation between the input signal events is quasi-static during the plurality of clock cycles.

14. The method of claim 9, further comprising applying a time-dependent dither to at least one common phase of the common sample clock.

15. The method of claim 14, wherein applying the time-dependent dither increases temporal resolution of the separation between the input signal events to better than one least significant bit of the plurality of TDCs.

16. The method of claim 9, further comprising changing a frequency of the common sample clock to prevent a phase-locking between the respective input signal events and common sample clock.

17. The method of claim 16, wherein the frequency of the common sample clock is changed based on the temporal separation between the input signal events.

18. A system for measuring a time difference between slowly varying signals with noise filtering in a digital domain to increase time-resolution of the measurement, comprising:
   open-loop oscillator to generate a common sample clock;
   a time-to-digital converter (TDC) system to:
      sample, over a plurality of clock cycles, a first signal with respect to a common sample clock and generate a first time-quantized digital signal; and
      sample, over the same number of clock cycles, a second signal with respect to the common sample clock and generate a second time-quantized digital signal; and
   a digital processor to form a difference between the first time-quantized digital signal and a second time-quantized digital signal and average the difference to obtain the time difference between the first signal and the second signal.

19. The system of claim 18, wherein the digital processor filters the difference through averaging.

20. The system of claim 18, wherein the TDC system comprises a single TDC, and wherein the first signal and the second signal are applied time-sequentially to an input of the single TDC over two different time windows to generate the first time-quantized digital signal and the second time-quantized digital signal.

* * * * *